United States Patent
Bu et al.

(10) Patent No.: US 9,748,398 B2
(45) Date of Patent: Aug. 29, 2017

(54) THIN FILM TRANSISTOR AND MANUFACTURING METHOD THEREOF, DISPLAY DEVICE

(71) Applicant: BOE TECHNOLOGY GROUP CO., LTD., Beijing (CN)

(72) Inventors: Qianqian Bu, Beijing (CN); Wei Guo, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 14/443,882

(22) PCT Filed: Sep. 28, 2014

(86) PCT No.: PCT/CN2014/087629
§ 371 (c)(1),
(2) Date: May 19, 2015

(87) PCT Pub. No.: WO2015/188522
PCT Pub. Date: Dec. 17, 2015

(65) Prior Publication Data
US 2016/0181437 A1    Jun. 23, 2016

(30) Foreign Application Priority Data

Jun. 13, 2014  (CN) .......................... 2014 1 0265114

(51) Int. Cl.
*H01L 29/10*    (2006.01)
*H01L 29/786*    (2006.01)
(Continued)

(52) U.S. Cl.
CPC .... *H01L 29/78675* (2013.01); *H01L 21/0262* (2013.01); *H01L 21/0273* (2013.01);
(Continued)

(58) Field of Classification Search
CPC ......... H01L 29/78675; H01L 21/02532; H01L 21/02592; H01L 21/0262; H01L 21/02675;
(Continued)

(56) References Cited

U.S. PATENT DOCUMENTS 4,837,180 A * 6/1989 Chao ................. H01L 29/42376
257/E29.135
6,613,620 B2 * 9/2003 Fujimoto .......... H01L 29/42384
257/E27.111
(Continued)

FOREIGN PATENT DOCUMENTS

CN    1466177 A    1/2004
CN    1612358 A    5/2005
(Continued)

OTHER PUBLICATIONS

International Search Report of PCT/CN2014/087629 in Chinese with English translation, mailed Feb. 26, 2015.
(Continued)

*Primary Examiner* — Tod T Van Roy
*Assistant Examiner* — Vu A Vu
(74) *Attorney, Agent, or Firm* — Collard & Roe, P.C.

(57) ABSTRACT

A thin film transistor, its manufacturing method, and a display device are provided. The method comprises: forming a gate metal layer (35), forming a step-like gate structure (352) by one patterning process; performing a first ion implantation procedure to forming a first heavily doped area (39a) and a second heavily doped area (39b), the first heavily doped area (39a) being separated apart from the second heavily doped area (39b) by a first length; forming a gate electrode (353) from the step-like gate structure (352); performing a second ion implantation procedure to form a first lightly doped area (38a) and a second lightly doped area
(Continued)

(38b), the first lightly doped area (38a) being separated apart from the second lightly doped area (38b) by a second length less than the first length. By the above method, the process for manufacturing the LTPS TFT having the lightly doped source/drain structure can be simplified.

20 Claims, 7 Drawing Sheets

(51) Int. Cl.
| | |
|---|---|
| H01L 21/28 | (2006.01) |
| H01L 21/02 | (2006.01) |
| H01L 21/027 | (2006.01) |
| H01L 21/265 | (2006.01) |
| H01L 21/3105 | (2006.01) |
| H01L 21/3213 | (2006.01) |
| H01L 27/12 | (2006.01) |
| H01L 29/167 | (2006.01) |
| H01L 29/423 | (2006.01) |
| H01L 29/66 | (2006.01) |

(52) U.S. Cl.
CPC .... *H01L 21/0274* (2013.01); *H01L 21/02532* (2013.01); *H01L 21/02592* (2013.01); *H01L 21/02675* (2013.01); *H01L 21/26513* (2013.01); *H01L 21/28* (2013.01); *H01L 21/31058* (2013.01); *H01L 21/32134* (2013.01); *H01L 21/32139* (2013.01); *H01L 27/1222* (2013.01); *H01L 27/1248* (2013.01); *H01L 27/1274* (2013.01); *H01L 27/1288* (2013.01); *H01L 29/167* (2013.01); *H01L 29/42372* (2013.01); *H01L 29/42384* (2013.01); *H01L 29/66757* (2013.01); *H01L 29/786* (2013.01); *H01L 29/78621* (2013.01)

(58) Field of Classification Search
CPC ........... H01L 21/0273; H01L 21/26513; H01L 21/31058; H01L 21/32134; H01L 21/32139; H01L 27/1222; H01L 27/1288; H01L 29/167; H01L 29/42372; H01L 29/42384; H01L 29/66757
USPC .......................................................... 257/66
See application file for complete search history.

(56) References Cited

U.S. PATENT DOCUMENTS

| | | | | |
|---|---|---|---|---|
| 6,661,066 B2* | 12/2003 | Kuroi | ................ | H01L 21/26586 257/344 |
| 6,991,974 B2* | 1/2006 | Tsao | .................. | H01L 29/66757 257/E21.413 |
| 7,465,958 B2* | 12/2008 | Arao | .................... | H01L 27/1214 257/347 |
| 7,759,178 B2 | 7/2010 | Kim et al. | | |
| 7,807,516 B2 | 10/2010 | Ohnuma et al. | | |
| 8,193,586 B2* | 6/2012 | Chen | ................ | H01L 21/28088 257/344 |
| 8,852,978 B2 | 10/2014 | Choi | | |
| 9,006,059 B2 | 4/2015 | Sun | | |
| 2005/0164462 A1 | 7/2005 | Kim | | |
| 2009/0305490 A1 | 12/2009 | Sera | | |
| 2012/0007086 A1* | 1/2012 | Oh | ........................ | H01L 29/458 257/59 |
| 2012/0289006 A1* | 11/2012 | Yuan | ................... | H01L 27/1288 438/158 |
| 2013/0078801 A1* | 3/2013 | Dong | ................. | H01L 21/0273 438/656 |

FOREIGN PATENT DOCUMENTS

| | | |
|---|---|---|
| CN | 1670930 A | 9/2005 |
| CN | 1893117 A | 1/2007 |
| CN | 1917155 A | 2/2007 |
| CN | 101431056 A | 5/2009 |
| CN | 101599458 A | 12/2009 |
| CN | 102881657 A | 1/2013 |
| CN | 103021820 A | 4/2013 |
| CN | 104064472 A | 9/2014 |

OTHER PUBLICATIONS

Notice of Transmittal of the International Search Report of PCT/CN2014/087629 in Chinese, mailed Feb. 26, 2015.

Written Opinion of the International Searching Authority of PCT/CN2014/087629 in Chinese with English translation, mailed Feb. 26, 2015.

Chinese Office Action in Chinese Application No. 201410265114.9 mailed May 23, 2016 with English translation.

* cited by examiner

THIN FILM TRANSISTOR AND MANUFACTURING METHOD THEREOF, DISPLAY DEVICE

CROSS REFERENCE TO RELATED APPLICATIONS

This application is the National Stage of PCT/CN2014/087629 filed on Sep. 28, 2014, which claims priority under 35 U.S.C. §119 of Chinese Application No. 201410265114.9 filed on Jun. 13, 2014, the disclosure of which is incorporated by reference.

FIELD OF THE INVENTION

At least one of embodiments of the present invention relates to a thin film transistor and manufacturing method thereof, display device.

BACKGROUND

Conventional manufacturing process for a Low Temperature Poly Silicon Thin Film Transistor (LTPS TFT in abbreviation) includes subsequently depositing a buffer layer and an amorphous silicon layer on a glass substrate; then performing crystallization treatment on the amorphous silicon layer on the buffer layer to obtain a poly silicon (p-si) layer; subsequently applying a gate insulation layer and a gate metal layer on the poly silicon layer; patterning the gate metal layer to form a gate pattern and implanting ion to the p-si by using the gate pattern as a mask, a desired heavily doped source/drain electrode structure being obtained by controlling the amount of the implanted ion; after that, performing a step of flattening a interlayer insulation layer, a source/drain electrode to obtain the LTPS TFT structure.

SUMMARY

At least one embodiment of the present invention provides a thin film transistor, its manufacturing method and a display device, by which the process for manufacturing the LTPS TFT with lightly doped source/drain electrode structure can be simplified.

In one aspect, at least one embodiment of the present invention provides a method for manufacturing a thin film transistor, the method comprises forming a gate metal layer; forming a step-like gate structure by one patterning process; performing a first ion implantation procedure to form a first heavily doped area and a second heavily doped area, the first heavily doped area being separated apart from the second heavily doped area by a first length; forming a gate electrode from the step-like gate structure; and performing a second ion implantation procedure to form a first lightly doped area and a second lightly doped area, the first lightly doped area being separated apart from the second lightly doped area by a second length less than the first length.

In a second aspect, at least one embodiment of the present invention provides a thin film transistor manufactured by the above method.

In a third aspect, at least one embodiment of the present invention provides a display device including the above described thin film transistor.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Figure 1A:
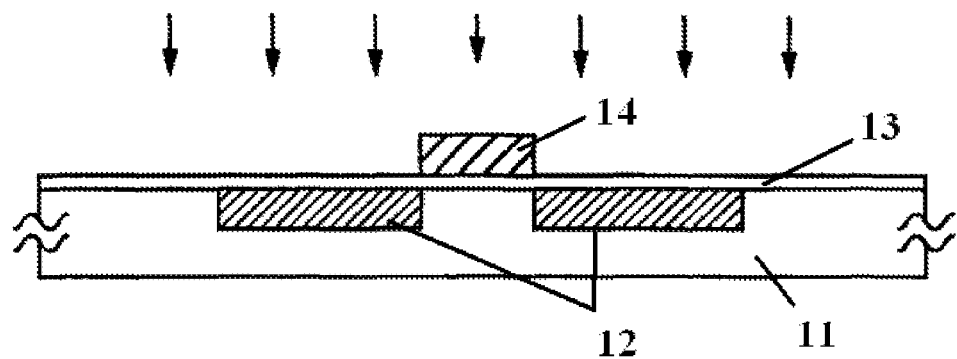
FIG. 1A to FIG. 1F are flowchart diagrams showing process steps for manufacturing a LTPS TFT.
Figure 1B:
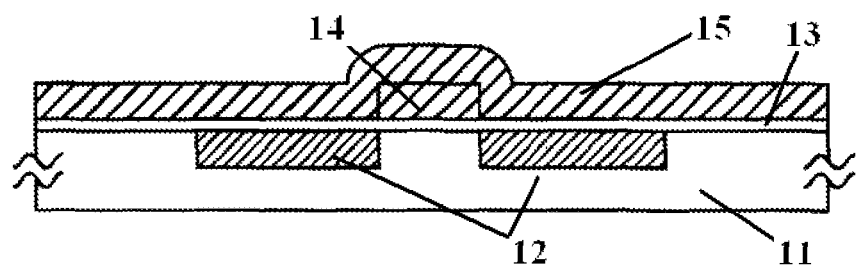
Figure 1C:
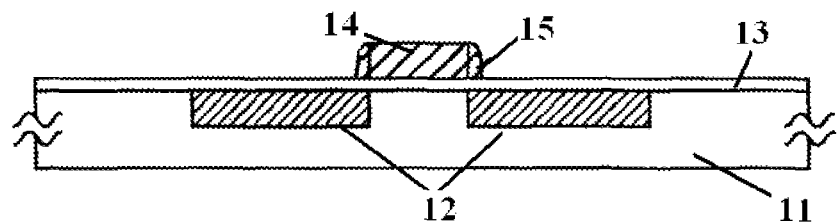
Figure 1D:
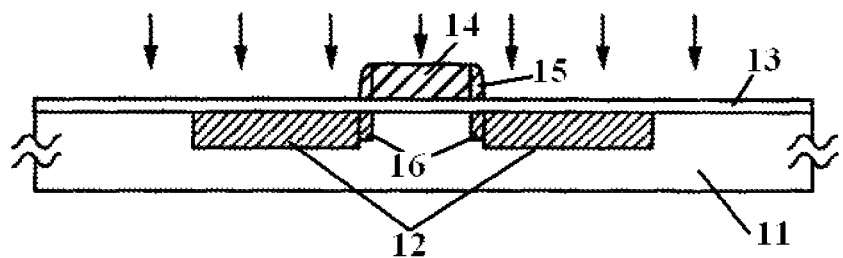
Figure 1E:
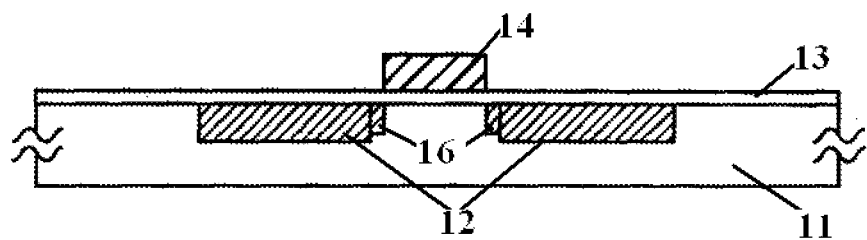
Figure 1F:
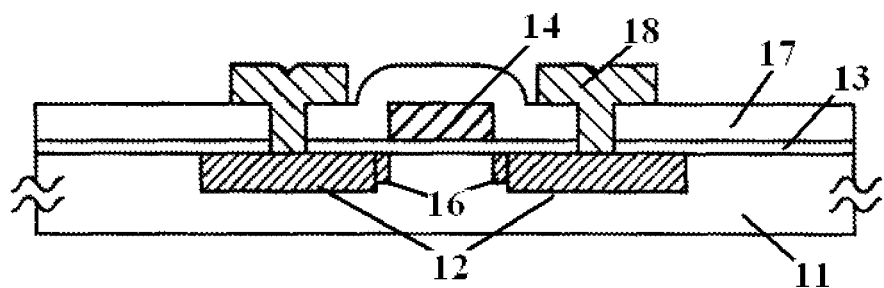

DESCRIPTION OF REFERENCE NUMERALS 11 poly silicon layer; 12 heavily doped area; 13 gate insulation layer; 14 gate conductor; 15 photoresist; 16 lightly doped area; 17 interlayer insulation layer; 18 source/drain electrode; 33 poly silicon layer; 34 gate insulation layer; 35 gate metal layer; 351 rectangular gate structure; 352 step-like gate structure; 353 gate electrode; 36 photoresist layer; 36' step-like structure; 361 first part photoresist; 362 second part photoresist; 363 photoresist structure; 37 channel; 38 lightly doped area; 38a first lightly doped area; 38b second lightly doped area; 39 heavily doped area; 39a first heavily doped area; 39b second heavily doped area; 310a source electrode; 310b drain electrode; 311 interlayer insulation layer/interlayer dielectric layer; 312 contact hole; 313 data line

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

The inventor of the present invention noticed that in the LTPS TFT structure obtained by heavily doping source/drain electrode structure, due to the high doping concentration of the two heavily doped areas and the very small space between the two heavily doped areas and the gate conductor, the electrical field near the source/drain electrode is so strong to cause a thermoelectronic effect, influencing the stability of the LTPS TFT.

Therefore, the LTPS TFT with lightly doped source/drain electrode structure is employed by insiders to alleviate the thermoelectronic effect. As shown in FIG. 1A to FIG. 1F, a process for manufacturing the LTPS with lightly doped source/drain electrode structure includes: forming a low temperature poly silicon layer 11 and forming a gate insulation layer 13 on the low temperature poly silicon layer 11; forming a gate conductor 14 on the gate insulation layer 13 by a patterning process; then, performing a first ion implantation procedure by using the gate conductor 14 as a mask to obtain a heavily doped source/drain electrode structure 12; then performing a second ion implantation procedure by using photoresist 15; removing the photoresist and obtaining a lightly doped source/drain electrode structure 16; and then subsequently forming an interlayer insulation layer 17, a source/drain electrode 18 to obtain the LTPS TFT including the lightly doped source/drain electrode structure.

By using the above method, the thermoelectronic effect in the current LTPS TFT structure can be alleviated, but during obtaining the LTPS TFT with the lightly doped source/drain electrode structure, more than two patterning processes are needed, which leads to a complex process for manufacturing the LTPS TFT with the lightly doped source/drain electrode structure.

A basic idea of the embodiments of the present invention is obtaining a gate electrode structure by one patterning process and obtaining a lightly doped area and a heavily doped area by two ion implantation procedures, by using a half-tone phase shift mask plate or a gray tone phase shift mask plate, so as to simplify the plural patterning processes during obtaining a lightly doped source/drain area and a heavily doped source/drain area in the process for manufacturing a LTPS TFT.

In order to reduce the number of the patterning processes during obtaining the lightly doped source/drain area and the heavily doped source/drain area in the LTPS TFT manufacturing process and simplify the manufacturing process, at least one embodiment of the present invention provides a method for manufacturing a thin film transistor. Hereinafter, the method will be described by taking a LTPS TFT as the thin film transistor as an example. The LTPS TFT can includes a semiconductor layer, a gate insulation layer and a gate electrode. The semiconductor layer can include two heavily doped areas, two lightly doped areas adjacent to the heavily doped areas, and a channel between the two lightly doped areas. The gate insulation layer covers a surface of the semiconductor layer. The gate electrode is located on the gate insulation layer, and covers an area corresponding to the channel.

Figure 2:
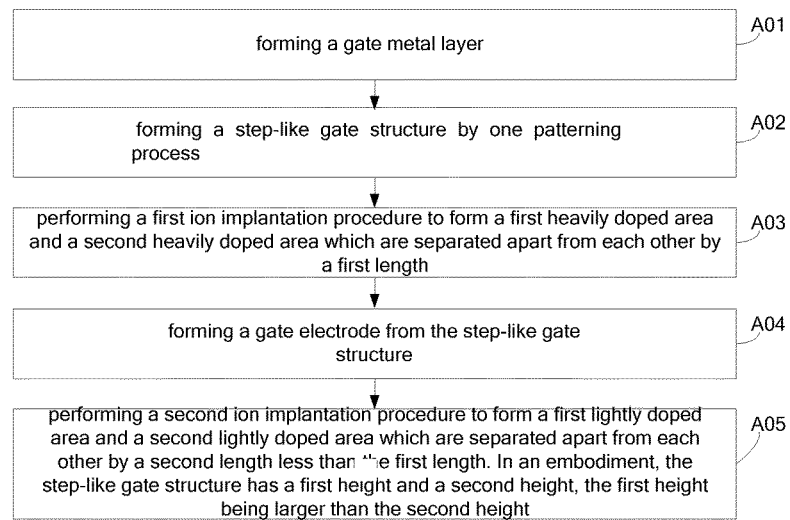
FIG. 2 is a schematic flowchart diagram showing a method for manufacturing a LTPS TFT as provided by an embodiment of the present invention.
Figure 3A:
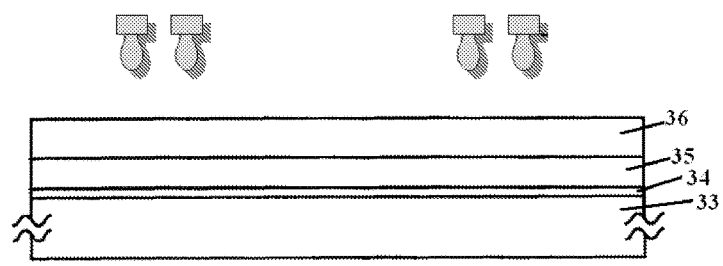
FIG. 3A to FIG. 3J are flowchart diagrams showing process steps for manufacturing a LTPS TFT as provided by an embodiment of the present invention.
Figure 3B:
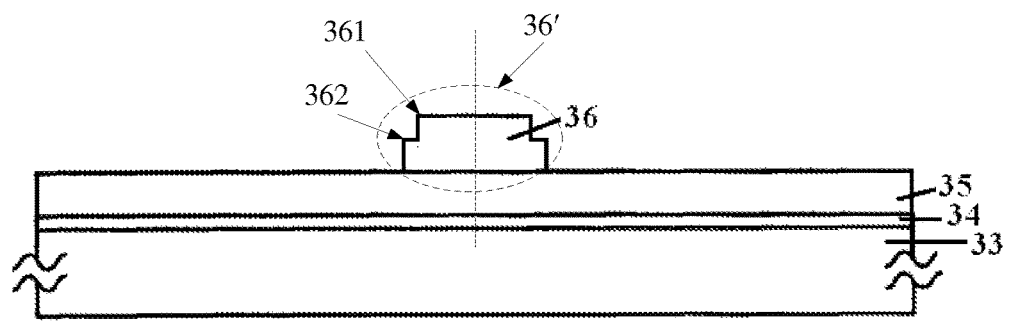
Figure 3C:
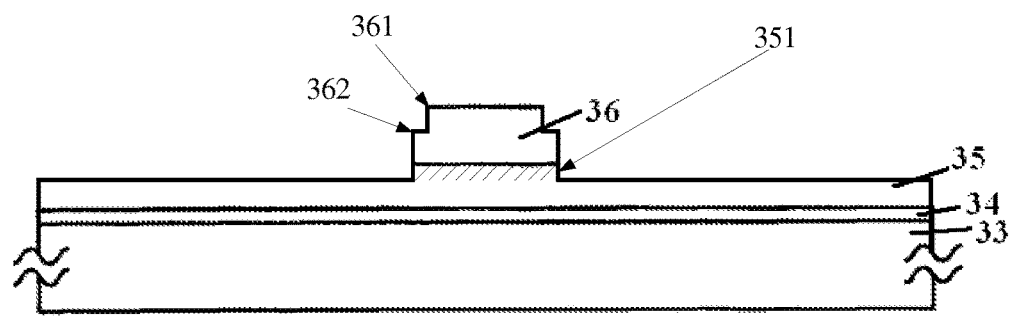
Figure 3D:
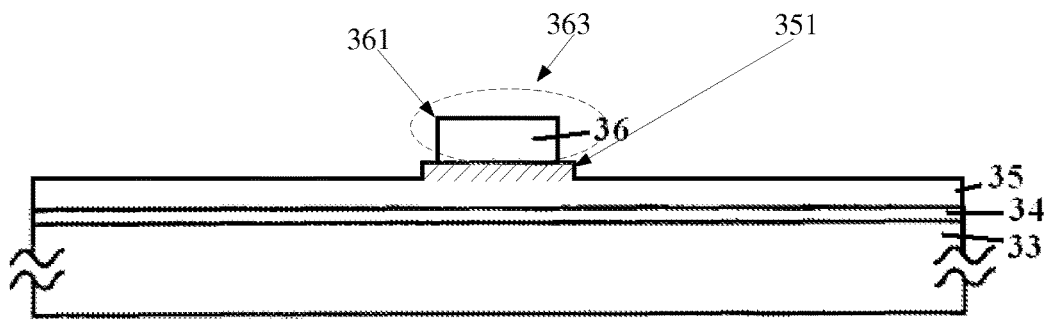
Figure 3E:
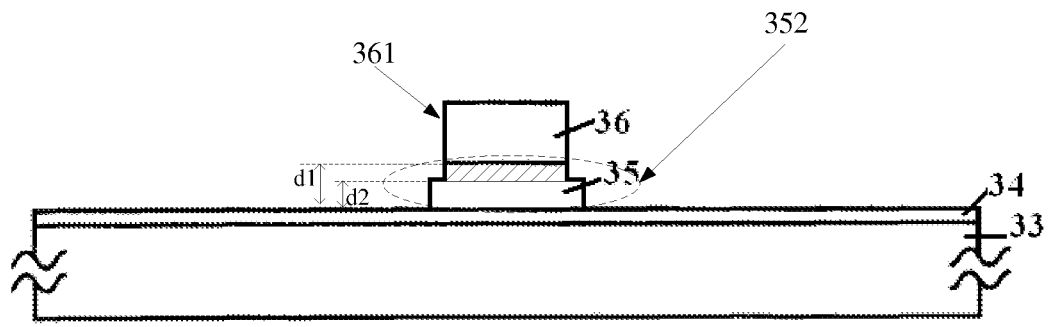
Figure 3F:
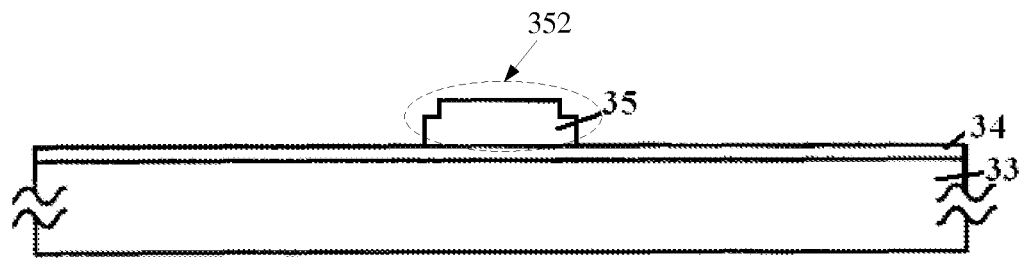
Figure 3G:
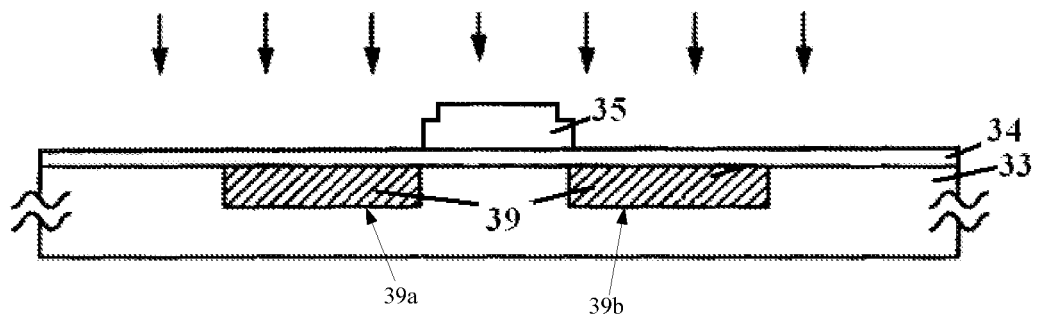
Figure 3H:
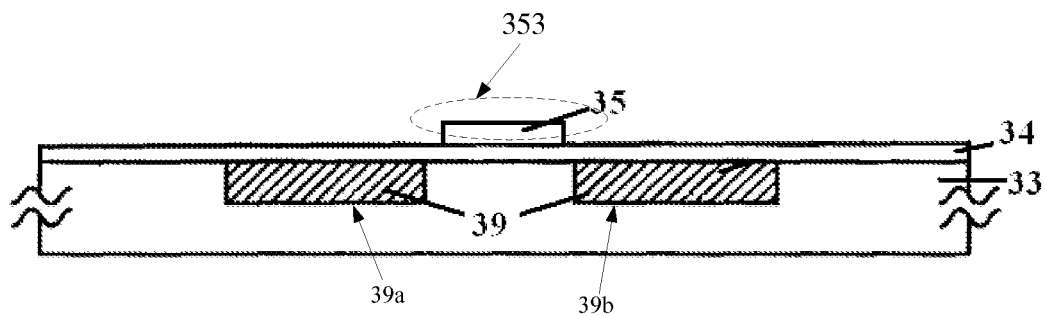

As shown in FIG. 2, the method may includes the steps of:

A01: forming a gate metal layer;

A02: forming a step-like gate structure by one patterning process (as shown in FIG. 3F);

A03: performing a first ion implantation procedure to form a first heavily doped area and a second heavily doped area which are separated apart from each other by a first length;

A04: forming a gate electrode from the step-like gate structure (as shown in FIG. 3H);

A05: performing a second ion implantation procedure to form a first lightly doped area and a second lightly doped area which are separated apart from each other by a second length less than the first length. In an embodiment, the step-like gate structure has a first height and a second height, the first height being larger than the second height.

In an embodiment, the above method can also include the steps of: after forming the first lightly doped area and the second lightly doped area, forming a interlayer dielectric layer with contact holes on a substrate with a gate electrode formed thereon; forming a patterns of source electrode, drain electrode and data line on the interlayer dielectric layer, wherein the source electrode is connected with the first heavily doped area via the contact hole penetrating the gate insulation layer and the interlayer dielectric layer, and the drain electrode is connected with the second heavily doped area through the contract holes penetrating the gate insulation layer and the interlayer dielectric layer.

That is, for example, the above method can include depositing a buffer layer on a base substrate, forming an amorphous silicon (a-Si) film on the buffer layer, converting the a-Si into poly silicon (p-Si) by a crystallization method, then depositing a gate insulation layer; after that, depositing a gate metal layer on the gate insulation layer, coating photoresist on the gate metal layer, patterning the gate metal layer by a half tone phase shift mask plate/grey tone phase shift mask plate process so as to be formed to a pattern with gradient (the step-like gate structure 352 as shown in FIG. 3F); next, performing the first ion implantation process to form the heavily doped areas, and sequentially etching the gate metal layer to form a gate electrode, after that, performing a second ion implantation process to form lightly doped areas; at this time, the remaining gate metal layer is only formed as the gate structure, and performing processes for forming an interlayer insulation layer, a source/drain electrode, and a flatten layer thereon, whereby the low temperature poly silicon thin film transistor having lightly doped source/drain electrode structure is formed.

In the above method, only one patterning process is used, thus, the complexity of the manufacturing method of the LTPS TFT is lowered down, the process for manufacturing the LTPS TFT is simplified, the production time is shortened, and the stability of the electronic device is improved.

Hereinafter, the method for manufacturing the LTPS TFT according to the present invention and its specific embodiments will be described in detail in connection with FIG. 3A to FIG. 3J.

Firstly, the step A01 of forming the gate metal layer is performed. The step A01 can include the following steps.

Firstly, a base substrate, for example, a glass substrate or a quartz substrate is provided, and a buffer layer is formed on the base substrate. The structures shown in FIG. 3A to FIG. 3J are all formed on the base substrate with the buffer layer, therefore, the base substrate with the buffer layer is not shown in FIG. 3A to FIG. 3J. It is noted that when the cleanness of the base substrate does not meet the requirement, the base substrate can be pre-washed firstly, and then the buffer layer is formed on the base substrate.

For example, the buffer layer can be formed on the base substrate by employing a Plasma Enhanced Chemical Vapor Deposition (PECVD in abbreviation) method. The buffer layer can have a thickness of 2000 Å to 6000 Å, and the material for the buffer layer can be selected from the group consisting of oxide, nitride or nitrogen oxide, and combination thereof. The buffer layer can be a single layer, double layers or multi-layers structure. For example, the buffer layer can be a single layer, a double layers or a multi-layers structure of SiNx, SiOx or Si(ON)x. In practical, the buffer layer may not be deposited so as to save the operating time.

Secondly, an amorphous silicon layer is formed on the buffer layer. For example, in an embodiment of the present invention, the amorphous silicon layer can be deposited by a Plasma Enhanced Chemical Vapor Deposition method.

Then, the amorphous silicon layer is converted into a poly silicon layer 33, for example, the poly silicon layer 33 can be formed by performing multiple laser annealing treatments to the amorphous silicon layer at a preset temperature; for example, the laser annealing treatment can be performed by employing an excimer laser.

In a specific application, the amorphous silicon layer can also be subjected to a high temperature treatment. The laser annealing treatment can be performed by dividing the amorphous silicon layer into a plurality of energy areas according to the thickness distribution of the amorphous layer and applying different laser annealing treatments to the different energy areas, so as to convert the amorphous silicon layer to the poly silicon layer 33. Herein, the high temperature treatment of the amorphous silicon layer is used for dehydrogenating the amorphous silicon layer, so as to prevent hydrogen explosion during laser annealing.

In the above embodiments, the buffer layer on the base substrate functions to prevent metal ions in the base substrate from diffusing into an active area of the LTPS TFT, and reduce the probability of generating defects and leakage current. On one hand, a suitable buffer layer can improve the quality of the back interface of the poly silicon, and prevent leakage current from generating at the back interface of the poly silicon; on the other hand, a suitable buffer layer can reduce heat transfer, and slow down the cooling rate of silicon upon being heated by laser.

Furthermore, a gate insulation layer 34 is formed on the poly silicon layer 33, and a gate metal layer 35 is formed on the gate insulation layer 34, as shown in FIG. 3A.

For example, the gate insulation layer 34 is coated on the poly silicon layer 33, and the gate metal layer 35 is formed by sputtering. For example, the gate insulation layer 34 is deposited on the poly silicon layer 33 by using a PEVCD method. The gate insulation layer 34 can be formed from oxide, nitride, or nitrogen oxide, or the like. In addition, the gate insulation layer 34 can be a single-layer, a double-layer or a multi-layer structure, and so on. For example, the gate metal layer 35 can be formed on the gate insulation layer 34 by employing magnetron sputtering, thermal evaporation, or PEVCD, or the like.

In the above embodiments of the present invention, the material for the gate metal layer 35 can be selected from the group consisting of Pt, Ru, Au, Ag, Mo, Cr, Al, Ta, Ti, W, and combination thereof.

In other embodiments, the process for forming the gate metal layer can also include: for example, providing a base substrate; forming a poly silicon layer on the base substrate; forming a gate insulation layer on the poly silicon layer; forming a gate metal layer on the gate insulation layer, and so on. In this embodiment, the semiconductor layer is illustrated as the poly silicon layer. The embodiments of the present invention is described only by way of example, but is not used to limit the process for forming the gate metal layer.

After that, the step A02 of forming a step-like gate structure by a patterning process is performed, as shown in FIG. 3A to FIG. 3F.

As shown in FIG. 3A, the photoresist layer 36 is formed on the gate metal layer 35. For example, the photoresist layer 36 is formed on the gate metal layer 35 by a coating method.

As shown in FIG. 3B, the photoresist layer 36 is exposed by using a half tone phase shift mask plate/grey tone phase shift mask plate so as to form a step-like structure 36' (the step-like structure as shown by the dashed line in FIG. 3B). For instance, the step-like structure here is symmetrically distributed about the dashed line in FIG. 3B. The step-like structure includes a first part photoresist 361 and a second part photoresist 362, the height of the first part photoresist 361 is larger than that of the second part photoresist 362. The reference numeral 36 in the step-like structure area in FIG. 3B denotes the photoresist layer.

It is can be understood that exposing the photoresist to form the step-like structure by using a half tone phase shift mask plate, for example, can include: exposing the photoresist layer 36 by using the half tone phase shift mask plate to cause form a non-exposure area, a partly exposure area and a fully exposure area in the photoresist layer 36; and then performing a development treatment, such that the non-exposure area corresponds to the first part photoresist 361, the partly exposure area corresponds to the second part photoresist 362, and the photoresist in the fully exposure area is totally removed. Of course, mask plates in other forms (such as grey tone phase shift mask plate) can also be used to expose the above photoresist layer 36 to form the above step-like structure, and the embodiments of the present invention is not limited thereto. The half tone phase shift mask plate in the present embodiment is a mask plate by which the step-like gate structure with two heights can be finally formed.

As shown in FIG. 3C, for example, an area of the gate metal layer 35 uncovered by the step-like structure 36' is etched by using a wet etch process to form a rectangular gate structure 351 below the step-like structure. It should be noted that in FIG. 3C, only a part of the layer structure of the gate metal layer 35 is wet etched and the gate metal layer 35 covering the gate insulation layer 34 is not totally etched. Of course, the gate metal layer 35 can also be etched by using a dry etching process, in an embodiment of the present invention. The rectangular gate structure 351 means that the structure has a rectangle shape in the sectional view.

As shown in FIG. 3D, the second part photoresist 362 of the step-like structure 36' is subjected to an ashing treatment, so as to form a photoresist structure 363 including the first part photoresist.

It can be understood that the ashing treatment is applied to all the regions of the base substrate with the photoresist formed thereon except for the first part photoresist 361 of the step-like structure 36', so as to remove the relative thin photoresist, that is, the second part photoresist 362 of the step-like structure, on the base substrate.

As shown in FIG. 3E, for example, a region of the gate metal layer uncovered by the photoresist structure is etched by a wet etch method to form a step-like gate structure 352, the step-like gate structure 352 has a first height d1 and a second height d2, the first height d1 is larger than the second height d2, and the region corresponding to the first height d1 of the step-like structure 352 is located below the photoresist structure 363. For instance, the step-like gate structure 352 shown in FIG. 3E can be a step-like gate structure symmetrically arranged. In FIG. 3E, the part denoted by 36 belongs to the photoresist layer, and the part denoted by 35 belongs to the gate metal layer. Of course, in an embodiment of the present invention, the gate metal layer can also be etched by a dry etch method to form the step-like structure 352.

As shown in FIG. 3F, the photoresist structure 363 above the step-like structure 352 is removed, to obtain the final step-like gate structure.

Then, the step A03 of performing a first ion implantation procedure is performed to form a first heavily doped area 39a and a second heavily doped area 39b. In the heavily doped area 39 as shown in FIG. 3G, the first heavily doped area 39a is separated from the second heavily doped area 39b by a first length.

For instance, the ion adopted in the first ion implantation procedure can be selected from the group consisting of B ion, P ion, As ion, PHx ion, and combination thereof.

Furthermore, the step A04 of forming a gate electrode from the step-like gate structure is performed, as shown in FIG. 3H. For instance, e.g. wet etching method is used to etch the step-like gate structure to form the gate electrode. In an embodiment, the thickness of the gate electrode is in the range of 1000 Å to 3000 Å. In the embodiment of the present invention, the gate electrode has a rectangular structure in the sectional view. Of course, in an embodiment of the present invention, dry etching method can also be used to etch the step-like gate structure to form the gate electrode.

It should be noted that during the wet etch process in this step, the size of the critical dimension should be strictly controlled to reduce deviation.

Figure 3I:
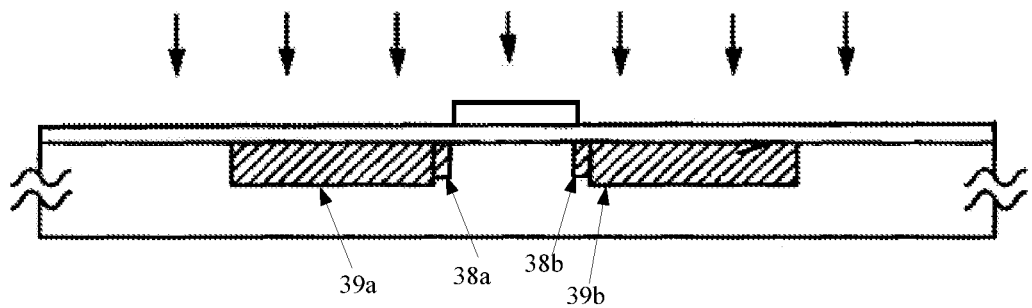

Next, the step A05 of performing the second ion implantation procedure is performed to form a first lightly doped area 38a and a second lightly doped area 38b, as shown in FIG. 3I. The first lightly doped area 38a is separated apart from the second lightly doped area 38b by a second length, and the second length is smaller than the first length.

For instance, the ion adopted in the second ion implantation procedure can be selected from the group consisting of B ion, P ion, As ion, PHx ion, and combination thereof.

It should be noted that the ion implantation dose in the first ion implantation procedure and the second ion implantation procedure needs to be controlled.

Figure 3J:
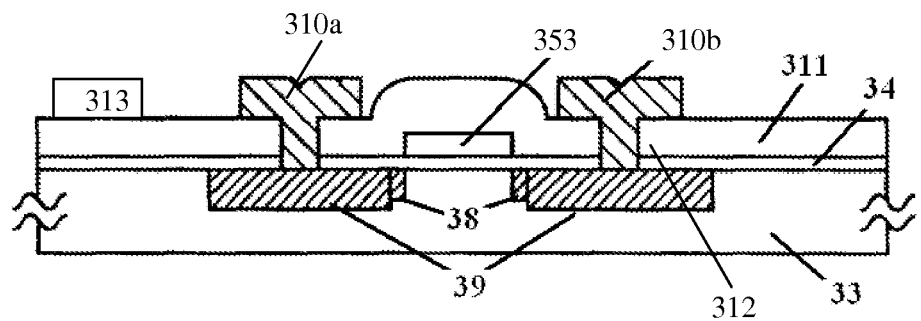

In addition, the method for manufacturing the thin film transistor provided by the embodiments of the present disclosure can further include forming an interlayer dielectric layer 311 including contact holes 312 on the base substrate with the gate electrode formed thereon, as shown in FIG. 3J. Patterns of source electrode 310a, a drain electrode 310b and data line 313 are formed on the interlayer dielectric layer. The source electrode 310a is connected with the first heavily doped area 39a through the contact hole 312 penetrating the gate insulation layer and the interlayer dielectric layer 311, and the drain electrode 310b is connected to the second heavily doped area 39b through the contact hole 312 penetrating the gate insulation layer 34 and the interlayer dielectric layer 311.

In the above method, a wet etching process for the gate metal layer 35 is added between the ion implantation procedure for the light doped area 38 and the ion implantation procedure for the heavily doped area 39, and the size of the critical dimension is strictly controlled during the process, thus the thermoelectronic effect of the LTPS TFT can be reduced, and the reliability of the electronic device can be improved.

At least one embodiment of the present invention further provides a thin film transistor made by using the method as described in the above embodiment, for example, the thin film transistor is the LTPS TFT fabricated by the above embodiment. The thin film transistor provided by the embodiment of the present invention can be applied to related field such as liquid crystal displays, OLED, and so on.

Figure 4:
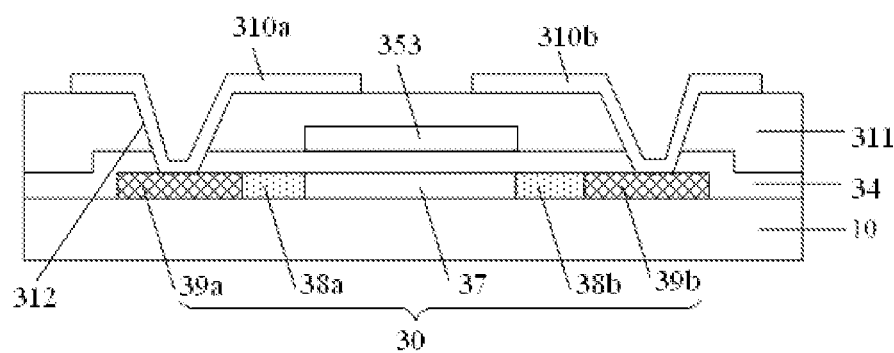
FIG. 4 is a schematic diagram showing the structure of a LTPS TFT as provided by an embodiment of the present invention.

For example, as shown in FIG. 4, the thin film transistor fabricated by the method as provided by the above embodiments of the present invention includes a base substrate 10, a semiconductor layer 30 provided on the base substrate 10, the semiconductor layer 30 including two heavily doped areas 39a, 39b and two lightly doped areas 38a, 38b, the heavily doped areas being adjacent to the lightly doped areas and the two lightly doped areas being separated by a channel 37; a gate insulation layer 34 covering a surface of the semiconductor layer 30; and a gate electrode 353 located on the gate insulation layer 34 and covering an area corresponding to the channel 37.

In an embodiment, the thin film transistor can further include an interlayer dielectric layer 311. The interlayer dielectric layer 311 covers the gate electrode 353 and the gate insulation layer 34 and includes a plurality of contact holes 312. A source electrode 310a and a drain electrode 310b are formed on the interlayer dielectric layer 311, the source electrode 310a and the drain electrode 310b respectively contact with the two heavily doped areas 39a, 39b through the contact holes 312 penetrating the gate insulation layer 34 and the interlayer dielectric layer 311.

In particular application, the above mentioned semiconductor layer 30 can be a poly silicon layer. In the thin film transistor provided by the embodiments of the present invention, the lightly doped areas and the heavily doped areas are formed by two ion implantation procedures, respectively.

At least one embodiment of the present invention further provides a display device including the thin film transistor fabricated by the above methods. Thus, the display device provided by the embodiment of the present invention has good display quality. The display device can be any product or component having display function, such as a display panel, an electronic paper, a television, a display, a digital picture frame, a mobile phone, a tablet computer, and so on.

In summary, in the thin film transistor, its manufacturing method and the display device as provided by the embodiments of the present invention, the step-like gate structure is formed on the base substrate with the gate metal layer formed thereon by a first patterning process, and then, a first ion implantation procedure and a second ion implantation procedure are preformed to obtain the lightly doped thin film transistor. During the process for obtaining the lightly doped source/drain area and the heavily doped source/drain area in the LTPS TFT provided by the embodiments of the present invention, the patterning process is performed only once, therefore, the manufacturing process of the LTPS TFT is simplified, the production time is shortened, and the stability of the electronic device is improved.

Finally, it is should be noted that all the above embodiments are only used to illustrate the technical solution of the present invention, but not used as a limitation thereto. Although the present invention has been described in detail with reference to the previous embodiments, it is understood that modification or equivalent substitution to a part of or all the technical features in the technical solution as described in the above embodiment can be made, and these modification and substitution will not cause the corresponding technical solution to depart from the scope of the present invention as defined in claims.

The present application claims the priority of Chinese Patent Application No. 201410265114.9 filed on Jun. 30, 2014, the Chinese Patent Application is entirely incorporated therein as a part of the present application by reference.

What is claimed is:

1. A method for manufacturing a thin film transistor, comprising:
    forming a single layered gate metal layer;
    forming the single layered gate metal layer into a step-like gate structure by one patterning process;
    performing a first ion implantation procedure to form a first heavily doped area and a second heavily doped area with the step-like gate structure as a mask, the first heavily doped area being separated apart from the second heavily doped area by a first length;
    forming a gate electrode with a single height value from the step-like gate structure; and
    performing a second ion implantation procedure to form a first lightly doped area and a second lightly doped area, the first lightly doped area being separated apart from the second lightly doped area by a second length less than the first length.

2. The method according to claim 1, wherein the step-like gate structure has a first height and a second height, the first height being larger than the second height.

3. The method according to claim 2, wherein the forming a step-like gate structure by one patterning process comprises:

forming a photoresist layer on the gate metal layer;
exposing the photoresist layer by using a half tone phase shift mask plate or a grey tone phase shift mask plate so as to form a step-like structure, wherein the step-like structure comprises a first part photoresist and a second part photoresist, the height of the first part photoresist is larger than the height of the second part photoresist;
etching an area of the gate metal layer uncovered by the step-like structure, so as to form a rectangular gate structure, the rectangular gate structure being located below the step-like structure;
ashing the second part photoresist of the step-like structure to form a photoresist structure comprising the first part photoresist;
etching an area of the gate metal layer uncovered by the photoresist structure to form the step-like gate structure, a first height area of the step-like gate structure being located below the photoresist structure; and
removing the photoresist structure above the step-like gate structure.

4. The method according to claim 1, wherein the forming a gate metal layer comprises:
providing a base substrate;
forming a buffer layer on the base substrate;
forming an amorphous silicon layer on the buffer layer;
converting the amorphous silicon layer into a poly silicon layer;
forming a gate insulation layer on the poly silicon layer; and
forming the gate metal layer on the gate insulation layer.

5. The method according to claim 1, wherein the forming a gate metal layer comprises:
providing a base substrate;
forming a semiconductor layer on the base substrate;
forming a gate insulation layer on the semiconductor layer;
forming the gate metal layer on the gate insulation layer.

6. The method according to claim 4, further comprising: after forming the first lightly doped area and the second lightly doped area,
forming an interlayer dielectric layer comprising contact holes on the base substrate with the gate electrode formed thereon;
forming patterns of source electrode, drain electrode and data line on the interlayer dielectric layer, the source electrode being connected with the first heavily doped area through the contact hole penetrating the gate insulation layer and the interlayer dielectric layer, and the drain electrode being connected with the second heavily doped area through the contact hole penetrating the gate insulation layer and the interlayer dielectric layer.

7. The method according to claim 4, wherein the converting the amorphous silicon layer into a poly silicon layer comprises:
performing a laser annealing to the amorphous silicon at a preset temperature to form the poly silicon layer.

8. The method according to claim 4, wherein the forming the amorphous silicon layer on the buffer layer comprises:
depositing the amorphous silicon layer on the buffer layer by a Plasma Enhanced Chemical Vapor Deposition method.

9. The method according to claim 1, wherein an ion adopted in the first ion implantation procedure and the second ion implantation procedure is selected from the group consisting of B ion, P ion, As ion, PHx ion, and combination thereof.

10. The method according to claim 1, wherein the forming the gate electrode form the step-like gate structure comprises:
wet etching the step-like gate structure to form the gate electrode.

11. The method according to claim 1, wherein the thickness of the gate electrode is in a range of 1000 Å to 3000 Å.

12. A thin film transistor, wherein the thin film transistor is manufactured by using the method according to claim 1.

13. A display device, wherein the display device comprises the thin film transistor according to claim 12.

14. The method according to claim 2, wherein the forming a gate metal layer comprises:
providing a base substrate;
forming a buffer layer on the base substrate;
forming an amorphous silicon layer on the buffer layer;
converting the amorphous silicon layer into a poly silicon layer;
forming a gate insulation layer on the poly silicon layer; and
forming the gate metal layer on the gate insulation layer.

15. The method according to claim 3, wherein the forming a gate metal layer comprises:
providing a base substrate;
forming a buffer layer on the base substrate;
forming an amorphous silicon layer on the buffer layer;
converting the amorphous silicon layer into a poly silicon layer;
forming a gate insulation layer on the poly silicon layer; and
forming the gate metal layer on the gate insulation layer.

16. The method according to claim 2, wherein the forming a gate metal layer comprises:
providing a base substrate;
forming a semiconductor layer on the base substrate;
forming a gate insulation layer on the semiconductor layer;
forming the gate metal layer on the gate insulation layer.

17. The method according to claim 3, wherein the forming a gate metal layer comprises:
providing a base substrate;
forming a semiconductor layer on the base substrate;
forming a gate insulation layer on the semiconductor layer;
forming the gate metal layer on the gate insulation layer.

18. The method according to claim 5, further comprising: after forming the first lightly doped area and the second lightly doped area,
forming an interlayer dielectric layer comprising contact holes on the base substrate with the gate electrode formed thereon;
forming patterns of source electrode, drain electrode and data line on the interlayer dielectric layer, the source electrode being connected with the first heavily doped area through the contact hole penetrating the gate insulation layer and the interlayer dielectric layer, and the drain electrode being connected with the second heavily doped area through the contact hole penetrating the gate insulation layer and the interlayer dielectric layer.

19. The method according to claim 14, wherein the converting the amorphous silicon layer into a poly silicon layer comprises:
performing a laser annealing to the amorphous silicon at a preset temperature to form the poly silicon layer.

20. The method according to claim 15, wherein the converting the amorphous silicon layer into a poly silicon layer comprises:

performing a laser annealing to the amorphous silicon at a preset temperature to form the poly silicon layer.

* * * * *